(12) United States Patent
Benn, Jr.

(10) Patent No.: US 6,410,846 B1
(45) Date of Patent: Jun. 25, 2002

(54) ELECTROMAGNETIC INTERFERENCE SHIELDING DEVICE

(75) Inventor: Robert C. Benn, Jr., Redding, CT (US)

(73) Assignee: Vanguard Products Corporation, Danbury, CT (US)

( * ) Notice: Subject to any disclaimer, the term of this patent is extended or adjusted under 35 U.S.C. 154(b) by 0 days.

(21) Appl. No.: 09/460,833

(22) Filed: Dec. 14, 1999

Related U.S. Application Data

(60) Provisional application No. 60/112,333, filed on Dec. 15, 1998.

(51) Int. Cl.$^7$ ............................................... H05K 9/00
(52) U.S. Cl. ............................ 174/35 GC; 174/35 R
(58) Field of Search ........................ 174/35 GC, 35 R, 174/35 MS

(56) References Cited

U.S. PATENT DOCUMENTS

| | | | |
|---|---|---|---|
| 2,519,850 A | 8/1950 | Pierson, Jr. ................... 174/35 |
| 3,140,342 A | 7/1964 | Ehrreich et al. ............... 174/35 |
| 3,206,536 A | 9/1965 | Goodloe ....................... 174/35 |
| 3,230,294 A | 1/1966 | McAdams .................... 174/35 |
| 3,253,618 A | 5/1966 | Cook ........................... 138/125 |
| 3,260,788 A | 7/1966 | Stetson ......................... 174/35 |
| 3,296,356 A | 1/1967 | McAdams .................... 174/35 |
| 3,446,906 A | 5/1969 | Zulauf ........................... 174/35 |
| 3,502,784 A | 3/1970 | Kunkel .......................... 174/35 |
| 3,505,463 A | 4/1970 | McAdams .................... 174/35 |
| 3,576,387 A | 4/1971 | Derby ........................... 174/36 |
| 3,583,930 A | 6/1971 | Ehrreich et al. ............. 252/514 |
| 3,752,899 A | 8/1973 | Bakker ......................... 174/35 |
| 3,783,173 A | 1/1974 | Twomey ....................... 174/35 |
| 3,889,043 A | 6/1975 | Ducros ......................... 174/35 |
| 4,037,009 A | 7/1977 | Severinsen ................... 428/241 |
| 4,288,081 A * | 9/1981 | Sado .............................. 277/1 |
| 4,399,317 A | 8/1983 | Van Dyk, Jr. ................. 174/35 |
| 4,447,492 A | 5/1984 | McKaveney ................. 428/328 |
| 4,575,578 A | 3/1986 | Bogan et al. ................. 174/35 |
| 4,690,778 A | 9/1987 | Narumiya et al. ........... 252/506 |
| 4,720,606 A | 1/1988 | Senn ............................. 174/35 |
| 4,749,625 A | 6/1988 | Obayashi et al. ............ 428/624 |
| 4,857,668 A | 8/1989 | Buonanno ..................... 174/35 |
| 4,960,633 A | 10/1990 | Hiza et al. .................... 428/215 |
| 4,968,854 A | 11/1990 | Benn, Sr. et al. ............. 174/35 |
| 5,008,485 A | 4/1991 | Kitagawa ...................... 174/35 |
| 5,105,056 A | 4/1992 | Hoge, Jr. et al. ......... 174/35 GC |
| 5,115,104 A | 5/1992 | Bunyan ................... 174/35 GC |
| 5,141,770 A | 8/1992 | Benn, Sr. et al. ............. 427/58 |
| 5,317,105 A | 5/1994 | Weber .......................... 174/35 |
| 5,522,602 A | 6/1996 | Kaplo et al. .................. 277/53 |
| 5,646,369 A | 7/1997 | Miska et al. ............ 174/35 GC |
| 5,902,956 A | 5/1999 | Spies et al. ............. 174/35 GC |
| 6,121,545 A * | 9/2000 | Peng et al. ............. 174/35 GC |
| 6,211,458 B1 * | 4/2001 | Mitchell et al. .......... 174/35 R |

FOREIGN PATENT DOCUMENTS

| | | |
|---|---|---|
| CA | 903020 | 6/1972 |
| CA | 1116650 | 1/1982 |
| EP | 0743815 | 11/1996 |

(List continued on next page.)

OTHER PUBLICATIONS

PCT International Search Report, Jan. 2000.
PCT Preliminary International Search Report Sep. 2000.
Nuemann et al., "Conductive Gasket", *IBM Technical Disclosure Bulletin*, vol. 17, No. 9, Feb. 1975, 2712, 1 page.

(List continued on next page.)

*Primary Examiner*—Bao Q. Vu
(74) *Attorney, Agent, or Firm*—Baker Botts LLP

(57) ABSTRACT

A gasket device for shielding electromagnetic radiation is comprised of several alternating areas of two different elastomeric materials, one of which is conductive. The areas of conductive material are substantially thinner than the other areas and provide a conductive path from one side of the gasket to the other.

17 Claims, 4 Drawing Sheets

FOREIGN PATENT DOCUMENTS

| | | |
|---|---|---|
| FR | 7511615 | 11/1976 |
| GB | 2029678 | 3/1980 |
| GB | 2129070 | 5/1984 |
| GB | 2174551 | 11/1986 |
| GB | 2222913 | 3/1990 |
| GB | 2224604 | 5/1992 |
| JP | 6214797 | 1/1987 |
| JP | 06085488 | 3/1994 |
| WO | 860049 | 1/1986 |

OTHER PUBLICATIONS

Crosby et al., "Conductive Seal for Electromagnetic Shielding in Electrical Enclosure", *IBM Technical Disclosure Bulletin*, vol. 20, No. 1, Jun. 1977, pp. 282–283.

Premier concepts in EMI shielding, Chomerics, Woburn, MA, Product Information Bulletin, Apr. 1987, 5 pages.

Schlegel EMI Shielding Gaskets, Technical Data Sheets, Rochester, NY, 1987, 2 pages. No month.

Application Updates, Chomerics, Woburn, MA 1987–1997, 37 pages. No month.

EMI Shielding Solutions for Commercial Electronics, Chomerics, Woburn, MA, 1989, 8 pages. No month.

EMI Shielding for Commercial Electronics, Chomerics, Woburn, MA, 1994, pp. 1–39. No month.

EMI Shielding for Military/Aerospace Electronics, Engineering Handbook, Chomerics, 1996, 146 pages. No month.

Vanshield EMI/RFI Gasketing and Shielding, Vanguard, Bulletin No. VS–195, N/D, 3 pages. No date.

CHO–WELT 2099, Chomerics Technical Bulletin No. 27, N/D, 1 page. No date.

Application Updates Fresh Approaches Which Solve EMI Shielding and Heat Dissipation Problems, Chomerics, Woburn, MA, vol. 1, N/D, 14 pages. No date.

Advertisement, The World's First Corrosion Resistant EMI/EMP Gasket Materials, Chomerics, Woburn, MA, N/D, 1 page. No date.

Advertisement, Today's Business Electronics Have Chomerics Written All Over Them, Chomerics, Woburn, MA, N/D, 1 page. No date.

Advertisement, Today's Communications Electronics Have Chomerics Written All Over Them, Chomerics, Woburn, MA, 1 page. No date.

Advertisement, EMI Shielding At a Fast Clip, Chomerics, Woburn, MA, N/D, 1 page. No date.

O Ring Spira–Combo, Technical Information, SPIRA, Burbank, CA, N/D, 1 page. No date.

* cited by examiner

ELECTROMAGNETIC INTERFERENCE SHIELDING DEVICE

SPECIFICATION

This nonprovisional application claims priority to United States Provisional Application Ser. No. 60/112,333 filed Dec. 15, 1998, which is hereby incorporated by reference.

TECHNICAL FIELD OF INVENTION

The present invention relates generally to the shielding of electronic devices from electromagnetic interference and in particular, to a gasket which minimizes the amount of conductive material necessary to provide an effective electromagnetic seal.

BACKGROUND OF INVENTION

In the area of electromagnetic interference shielding, particularly for the computer industry, a problem has arisen. With reference to FIG. 1, on the backside of a typical personal computer or business small workstation 2, is a relatively large opening covered with panel 4 to accept necessary connections, e.g., mouse, keyboard, printer, telephone line, etc. This panel presents extraordinary problems to the electromagnetic interference shielding engineer due to the variety of openings or seams which can radiate energy from within the device to the environment.

FIG. 2 is an overhead cut-away view of the back of a typical computer. An intermediate plate 7, usually light-gauge stainless steel, is sandwiched between the frame of the case 14 and the connectors 10 which interface with the motherboard 17. Due to irregularities in the frame 14, the stainless plate 7, and the connectors 10 themselves, a number of gaps and slot openings are created which tend to leak electromagnetic energy into the room. In the last few years, with the frequencies of the emissions becoming greater and greater, the need to shield these gaps and slot openings has increased. The conventional nickname which describes this area is the input/output plane, hereafter referred to as the "I/O backplane."

The most popular fix at the current time is to seal this area with a gasket of the type illustrated in FIGS. 3–5. The gasket is comprised of thermoplastic foam 18 which has been wrapped with a conductive fabric 21. The gasket is in a strip form with a width approximately equivalent to the width of the I/O backplane opening. The gasket thickness is approximately ⅛ inch, or enough to make contact between the connectors and the intermediate stainless steel plate. The holes 24 in the fabric strip shown in FIG. 4 are die-cut away so as to allow the connectors to be accessible to the end user. The termination to ground is made by the fabric 21 contacting the connector base, and grounding to the intermediate plate 7. The intermediate plate 7 must make contact to the frame 14, and this is usually achieved by several stainless steel fingers or divets 15 which protrude off the edges of the intermediate plate 7 and rub against the inner wall of the frame 14.

The problems or shortcomings of the current approach to the problem are as follows:

1. The ground between the intermediate plate and the gasket allows energy to travel along the interface and can reach the end of the gasket which has an open slot. Energy can leak at either end and result in a concentration of energy, or an antennae effect. Presumably, this can also occur at the die-cut holes, since the action of making the hole exposes the non-conductive foam core. That is, the die-cut hole is another antennae.

2. The construction of the fabric over thermoplastic foam is only fair in its physical performance attributes. The foam core is prone to compression set, particularly in the case of urethane foam. After as little as thirty days in compression, the urethane can take up to a 50% set at room temperature. Furthermore, the fabric imparts a stiffness to the strip which increases the deflection force needed to compress the gasket.

3. Multiple manufacturing steps must be performed. The fabric is woven, and subsequently plated with conductive metal. The fabric must then be slit to the proper width. The foam portion of the gasket is made by many manufacturers in a separate step. Usually, the fabric is wrapped around the foam separately with an adhesive. Subsequently, the gasket has an outer pressure-sensitive adhesive applied which provides the end user a means to fasten the gasket to the intermediate plate.

4. The intermediate plate is relied upon to provide attachment and stability to the frame. Unfortunately, the intermediate plate itself is somewhat flimsy and not always the best support to handle the compressive load of the gasket.

SUMMARY OF THE INVENTION

In accordance with the present invention, thin strips, or bars, of a conductive elastomeric material are interposed in a primary gasket material to provide a conductive path between conductive surfaces on either side of the gasket where the conductive bars are exposed.

In accordance with a further aspect of the invention, the gasket is generally planar and portions of the primary gasket material are cut out to permit connectors to pass through as is desirable in a gasket for an I/O backplane. The cut out portions expose the conductive bars to the connector thereby providing a conductive path to ground.

It is therefore an object of the present invention to provide a flexible conductive gasket for providing effective electromagnetic interference shielding while minimizing the amount of expensive conductive material used.

It is a further object to provide a flexible conductive gasket which solves the above-mentioned problems with the prior art.

For a better understanding of the present invention, together with other and further objects, reference is made to the following description, taken in conjunction with the accompanying drawings and its scope will be pointed out in the appended claims.

DETAILED DESCRIPTION OF THE INVENTION

Figure 6:
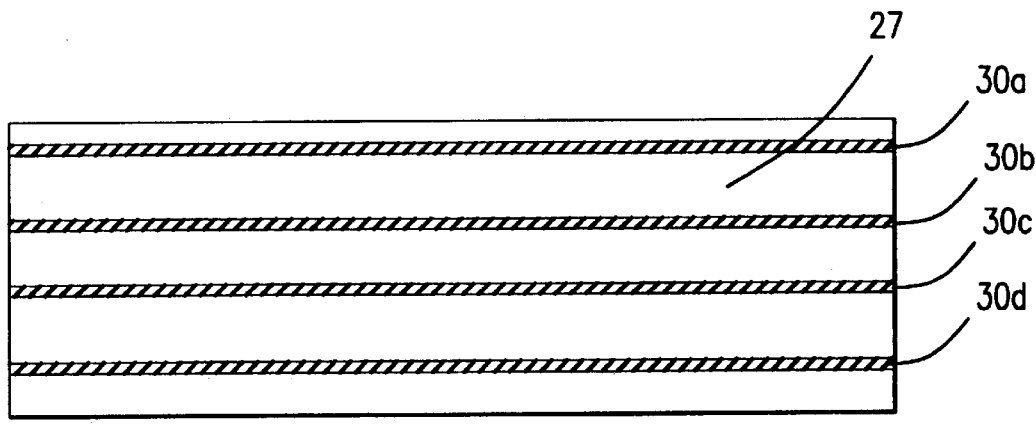
FIG. 6 is a plan view of one embodiment of the present invention.
Figure 7:
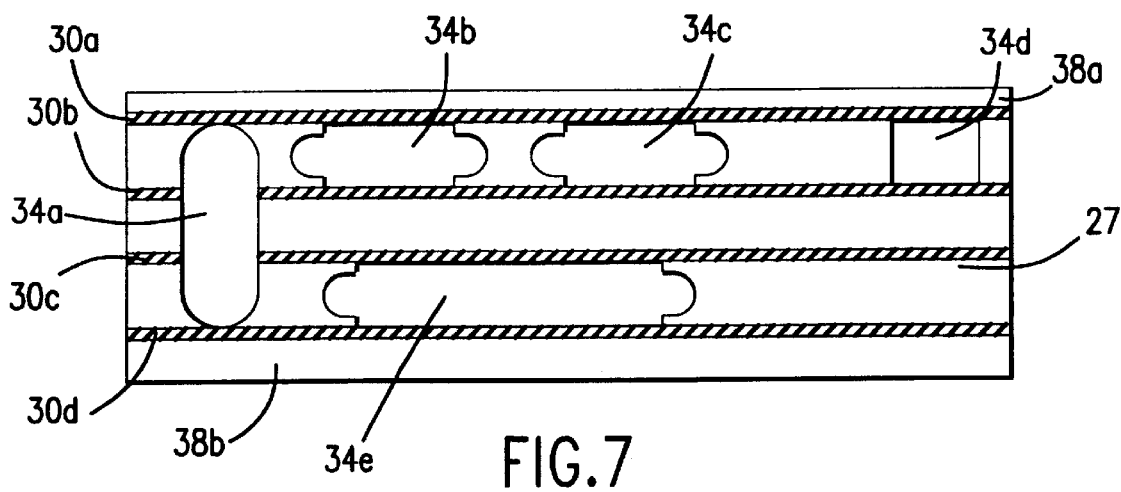
FIG. 7 is a plan view of the inventive gasket of FIG. 6 with connector-receiving cut outs.
Figure 8:
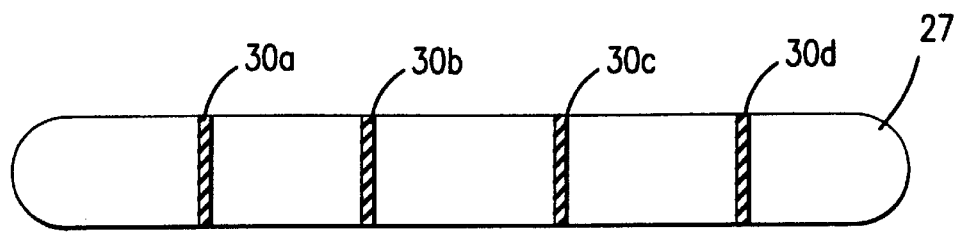
FIG. 8 is an end cross-sectional view of the inventive gasket of FIG. 7.

With reference to FIGS. 6–8, according to the present invention, a gasket is made primarily from an easily compressible extruded foam or sponge 27 with intermittently spaced conductive bars 30a, 30b, 30c and 30d. In view of the above-described shortcomings of thermoplastic foam, the primary gasket material is preferably a nonconductive thermoset rubber, such as a silicone, which exhibits superior compression set resistance. Superior compression set resistance aids in long term performance, since most every electromagnetic interference gasket construction relies on compressive load for maximum performance. Suitable silicone materials include commercially available heat curable sponge silicones such as C-1492 available from Wacker Chemie. The following is an illustrative formula for the primary gasket material using C-1492:

| Wacker C-1492 | 97.5–99% by weight |
|---|---|
| Dicumyl peroxide | 1–2% by weight |
| tert-Butyl perbenzoate | 0–0.5% by weight |

Alternatively, one may formulate a suitable primary gasket material from low vinyl silicones such as KE-76BS, available from Shin-Etsu, Inc., to which a suitable blowing agent, such as an azodicarbonamide available from Ritchem Co., Inc. is added. The following is an illustrative formula using these materials:

| KE-76 BS | 80% by weight |
|---|---|
| Ritchem blo-foam CF-910 | 2–4% by weight |
| Dicumyl peroxide | 0.8–1.6% by weight |
| Cab-O-Sil (Cabot) M-350 | 14.4–17.2% by weight |

Other thermoset materials which might be utilized as the primary gasket material include fluorosilicone, EPDM, nitrile, epichlorohydrin, natural, chloroprene, isoprene, and butyl elastomers. Depending on the needs of a particular application, any of the above materials could be used as sponged or foamed materials, where sponge is medium density range, and foam would be in a low density range. Also of possible use are the thermoplastic materials, such as soft PVC, polyurethane and santoprene, particularly in the foamed condition.

Figure 1:
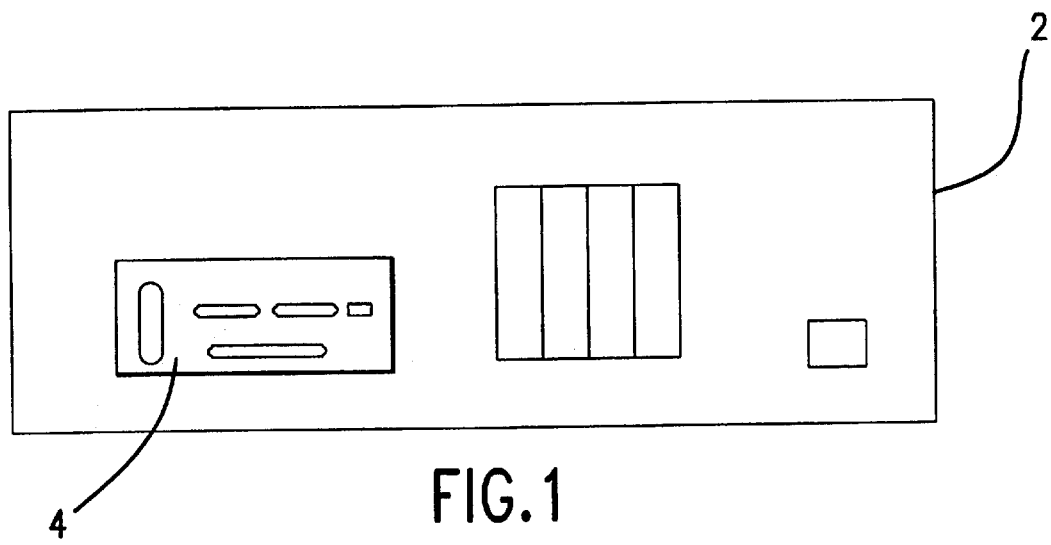
FIG. 1 is an elevation view of the backside of a typical personal computer or business small workstation.
Figure 2:
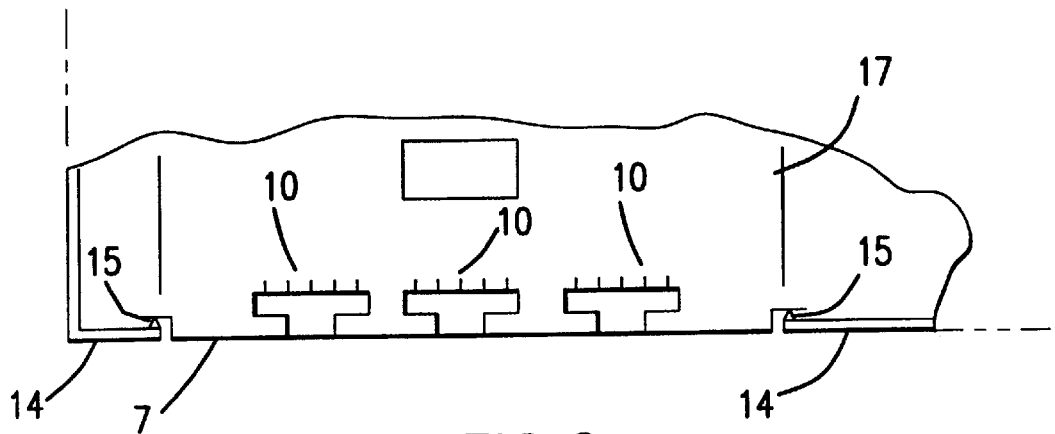
FIG. 2 is a plan cross-sectional view of a typical personal computer or business small workstation.
Figure 3:
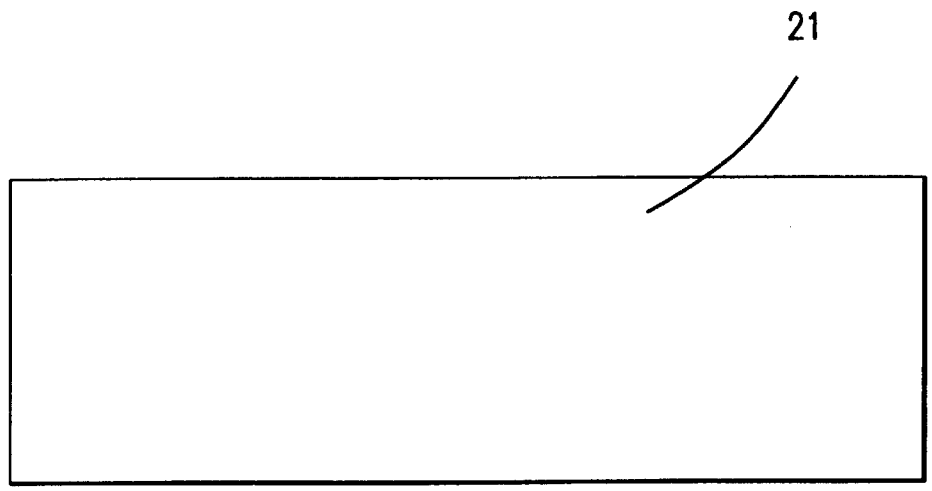
FIG. 3 is a plan view of a prior art gasket.
Figure 4:
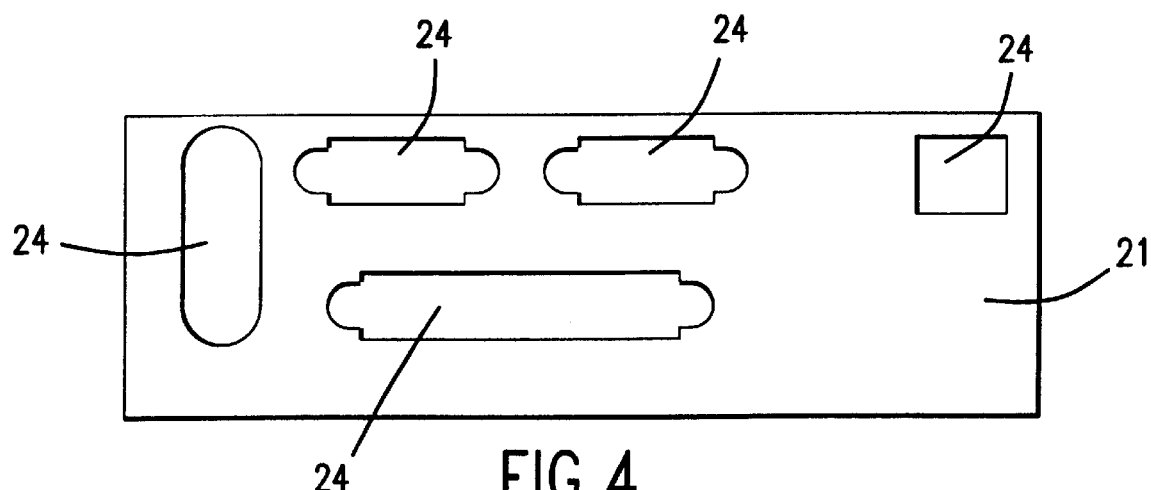
FIG. 4 is a plan view of the prior art gasket of FIG. 3 with connector-receiving cut outs.
Figure 5:
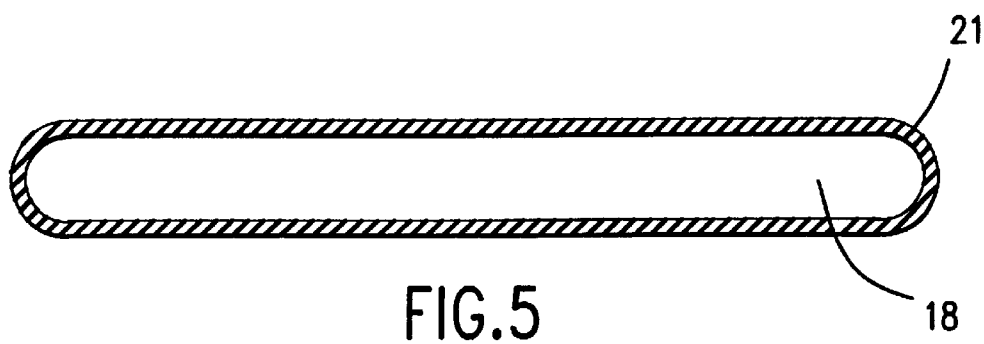
FIG. 5 is an end cross-sectional view of the prior art gasket of FIG. 4.

A ground through the gasket to the intermediate plate is achieved using very thin conductive rubber bars 30a, 30b, 30c, 30d. As seen in FIG. 8, the conductive bars protrude through the cross-section so as to effect grounding from top to bottom, and thereby separating the segments of the compressible extruded foam or sponge 27 from one another. The thickness of the extrusion will be the typical path length to grounding between the intermediate plate and the connector's housing, thereby minimizing the conductive path and improving shielding effectiveness values. In the prior art system of FIGS. 3–5, the wave must travel completely around the circumference of the gasket to reach ground, allowing for reflection, radiation, refraction, and escape to other surfaces. Additionally, the conductive bars offer superior shielding effectiveness when compared to the conductive cloth style of product.

The conductive bars will preferably be a rubberized conductive metal which exhibits good electrical performance and is flexible. Any rubber binder material will suffice, and the metals can include silver, nickel, aluminum, copper and stainless steel. A silicone binder with conductive silver or nickel particles has been found to work well. The following is an illustrative formula:

| General Electric Gum No. SE-33 | 100 parts per hundred |
|---|---|
| Technic Silver flake No. 135 | 250 to 1,00 pph, typical 300–350 |
| Cabot Cab-O-Sil M-5 | 5 to 30 pph, typ 8–12 |
| Union Carbide Organosilane A174 | 0.5 to 5 pph, typ 1–3 |
| Dicumyl peroxide | 0.5 to 5 pph, typ 1–2 |

In the preferred embodiment, the distances between the conductive bars, i.e., the widths of the extruded foam or sponge segments 27, are a function of the size of the connector holes, 34a, 34b, 34c, 34d. The bars are spaced apart such that they will straddle the holes, such spacings measuring, by way of example only, approximately one-half inch. In FIG. 7, connector hole 34a is straddled by conductive bars 30a and 30d; connector holes 34b, 34c and 34d are each straddled by conductive bars 30a and 30b; and connector hole 34e is straddled by conductive bars 30c and 30d. This straddling of the connector holes traps and grounds any emissions which might escape out of the connector portal area. This straddling also has an added benefit of minimizing many low- to mid-frequency radiation since the spacing will, in many cases, reduce the amplitude of the traveling wave.

Minimization of the width of the conductive bars will improve compressibility and reduce cost. Widths in the range of 0.5 mil to 20 mils, with a width of 2 to 6 mils being preferred, provide a good tradeoff between flexure and conductivity.

Enhancement of the electromagnetic shielding properties of the present invention may be obtained by applying a coating of a thin, conductive layer to the ends of the strip gasket 38a, 38b so as to prevent extremely high frequency radiation from escaping between the bars. This creates a simulated "cage" effect, capturing stray radiation in the x, y and z axes.

The conductive bars are preferably co-extruded with the remainder of the gasket in a single pass operation. In such a system, a master die holder which brings the two materials, conductive and nonconductive, together in the raw, unvulcanized (in the case of thermoplastics, molten) state is utilized. The primary material, i.e., the nonconductive material, is extruded in the manner of a typical single extrudate, i.e., the highly viscous material is pumped through the extruder into its head zone, and then into the master die holder. The initial set of forming/shaping dies are essentially the same as used in single die plate extrusion technology which is well-known, the die shape or pattern here being a series of individual rectangles with gaps between them. Several extruder manufacturers, such as Versa-Davis Standard and Troester Co., publish literature on how to accomplish single die plate extrusion.

The primary, nonconductive material is shaped and pushed into a blending or transition region, under the high pressures of extrusion. Typical pressure is about 1500 psi, but the pressure can range from 300 to 10,000 psi. In the short transition region, the secondary, conductive material is introduced. The delivery of this material to the precise areas in the transition zone may be accomplished using a series of runners which direct the secondary, conductive material to the desired locations. The material is injected from top and bottom into the areas lacking primary material. The upper surfaces of the primary, nonconductive rectangles are preferably protected by a series of blocks which interlock into the forward exit plate. These interlocks help ensure a nice, clean surface on the nonconductive element.

The runners discussed above may have additional control valves, known in the plastics industry as "gates." Using the control valves, the width and, to a degree, the shape and stress achieved in the finished bar can be modulated. After the blending/transition zone, the now-married fluids enter an exit plate which resembles the finished part height and width dimensions. The exit plate allows for thermal shrinkage, stress relief, and sizing considerations relating to sponges and foams. The expansion and contraction of the part as relates to the sponging reaction chemistry used should also be taken into account. A master die holder heated uniformly or by zone may also be employed. The heating enables one to begin the crosslinking reaction under the pressure conditions of extrusion which tends to improve conductivity of the finished article. Those skilled in the art of co-extrusion, for example in making and designing striping tools for the medical extrusion community, will be familiar with the above-described co-extrusion techniques.

Alternative methods of manufacture include a method whereby the segments are manufactured individually. The conductive segments are extruded as thin conductive strips and the nonconductive segments are extruded as rectangles, the width of the rectangles determining the spacing distance required for matching to the connector layout. The segments are then laminated together, alternating the conductive and nonconductive segments to achieve the configuration which matches the connector layout.

Another alternative manufacturing method would be to calendar sheets of the two materials in wide formats, then laminate the sheets together in alternating fashion. Subsequently, the laminate would be sliced across the direction of the lamination to yield the desired construction. For example, a calendared sheet of conductive material can be manufactured at a desired thickness by whatever the practical width of a good calendar mill is available. The sheet would be wound into rolls and stored. Thereafter, the same calendar mill could be used to make the nonconductive sponge or foam material in a desired thickness and matching the width of the conductive sheet. Again, the sheet would be wound into rolls and stored. Subsequently, the sheets would be taken in alternating fashion and laminated together resulting in a "log roll." The log roll would then be sliced perpendicular to the width dimension. The slice would be of a dimension so as to fill the gap between the connectors and the plate at the I/O backplane. This method would be useful for large volume applications where, for example, one to two million units are being produced.

Yet another manufacturing method involves extrusion of the nonconductive segments in long lengths or reels. The nonconductive extrusions are laid out in a template or bed, side by side, leaving a distance between the extrusions which corresponds to the desired width of the conductive bars. The bed might only be several feet in length, and is used to automatically dispense a slurry of conductive material of low viscosity to fill the vacant areas. In this way, a semi-automatic, robotic system can be utilized to make the product. The finished part is then cut down to the proper size.

While the invention has so far been described in conjunction with gaskets intended to address the particular problems of the I/O backplane of computers, the invention may also be used with smaller sealing gaskets, such that a traditional gasket such as a D-shaped bulb or P-shaped bulb might be replaced with a strip with one conductive bar through the center of the shape. This would offer cost savings over prior art conductive gaskets, such as disclosed in U.S. Pat. No. 4,968,854, since it would further minimize the amount of precious metal in a given shape. This embodiment of the present invention is shown in FIGS. 9 and 10.

Figure 9:
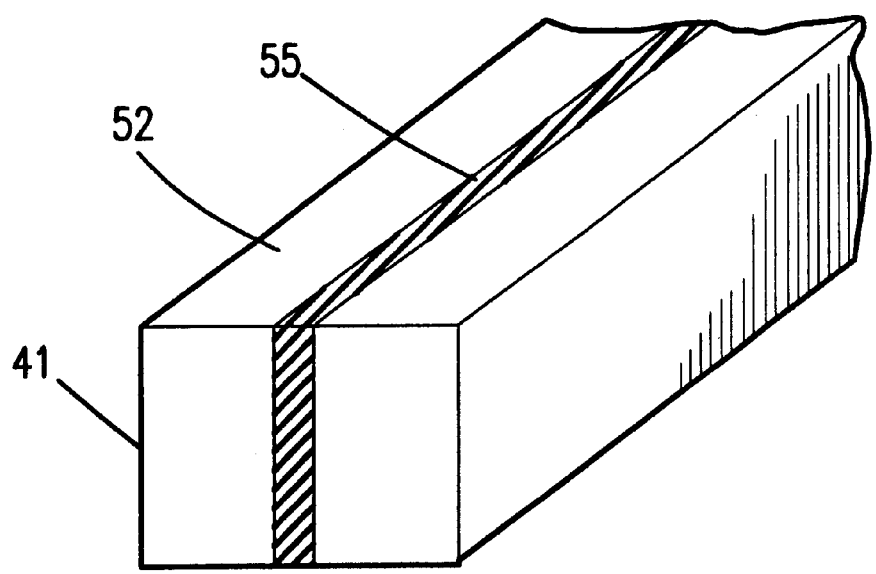
FIG. 9 is a perspective view of another embodiment of the present invention.
Figure 10:
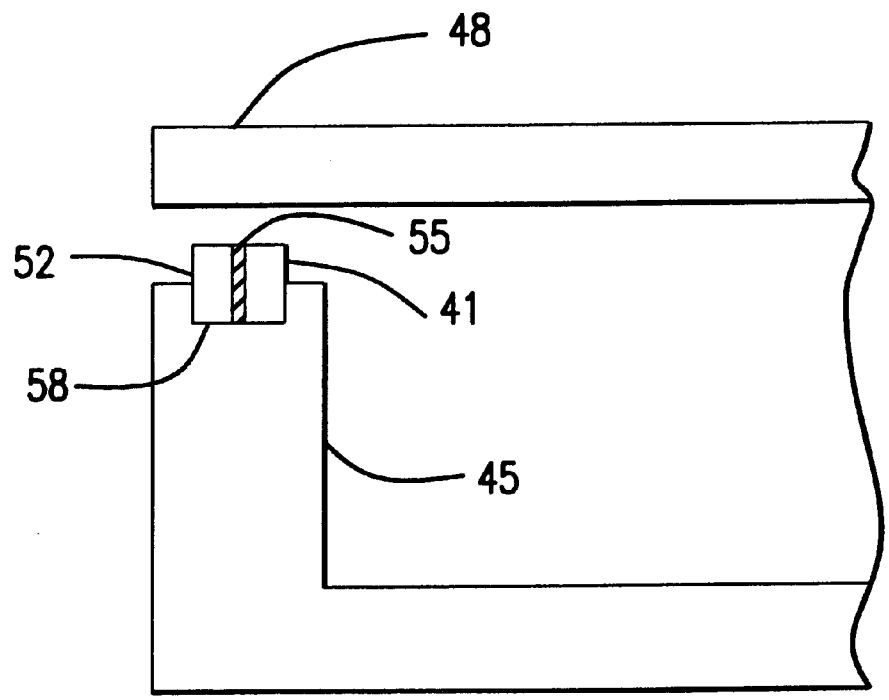
FIG. 10 is a side elevation cross-sectional view of the gasket of FIG. 9 in an enclosure.

FIG. 9 shows a strip gasket 41 of rectangular cross section having a conductive bar 55 running the length of the gasket. The primary gasket material 52 is on either side of the conductive bar 55. FIG. 10 depicts the gasket 41 in an electronic enclosure 45 having a groove receptor 58 for the gasket 41. The gasket provides a ground from the enclosure 45 to a lid 48.

While this invention has been described with reference to several illustrative examples and embodiments, they should not be interpreted as limiting the scope or spirit of the invention. In actual practice many modifications may be made by those of ordinary skill in the art without deviating from the scope of the invention as expressed in the appended claims.

I claim:

1. A gasket device for shielding electromagnetic radiation comprising at least three alternating areas of a first elastomer material and a second elastomer material, said second elastomer material being conductive, and each of said areas having length, width and thickness dimensions, each of said areas having substantially the same thickness dimension, and each of said areas of said first elastomer material having a width dimension substantially greater than the width dimension of each of said areas of said second elastomer material.

2. The gasket device of claim 1 wherein the total of said width dimensions are substantially greater than said thickness dimension.

3. The gasket device of claim 2 wherein at least one of said areas of said first elastomer material has a cut out portion adapted to receive an electrical connector, said cut out portion having a width dimension at least equal to the width dimension of said area of said first elastomer material, whereby at least two areas of said second elastomer material are exposed in the cutout portion.

4. The gasket device of claim 1 wherein the total of said width dimensions are of the same order of magnitude as said thickness dimension.

5. The gasket device of claim 1 wherein said width dimension of each of said areas of second elastomer material is in the range of 0.5 to 20 mils.

6. The gasket device of claim 1 wherein said width dimension of each of said areas of second elastomer material is in the range of 2 to 6 mils.

7. The gasket device of claim 3 wherein said width dimension of each of said areas of second elastomer material is in the range of 0.5 to 20 mils.

8. The gasket device of claim 3 wherein said width dimension of each of said areas of second elastomer material is in the range of 2 to 6 mils.

9. The gasket device of claim 1 wherein said first elastomer material comprises a thermoset rubber.

10. The gasket device of claim 9 wherein the thermoset rubber is a silicone material.

11. The gasket device of claim 1 wherein said first elastomer material comprises a thermoplastic material.

12. The gasket device of claim 1 wherein said second elastomer material comprises a thermoset rubber binder and conductive metal.

13. The gasket device of claim 12 wherein said thermoset binder is a silicone material.

14. The gasket device of claim 12 wherein said conductive metal is silver.

15. The gasket device of claim 1 wherein each area has conductive ends.

16. The gasket device of claim 1 wherein the areas of the first and second elastomer materials are formed by coextrusion.

17. The gasket device of claim 1 wherein the areas of the first and second elastomer materials are formed separately by extrusion and then laminated together.

* * * * *